United States Patent
Yu et al.

(10) Patent No.: US 7,710,182 B2
(45) Date of Patent: May 4, 2010

(54) RELIABLE LEVEL SHIFTER OF ULTRA-HIGH VOLTAGE DEVICE USED IN LOW POWER APPLICATION

(75) Inventors: Hung Chang Yu, Hsin-Chu (TW); Fei Xu, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 12/175,464

(22) Filed: Jul. 18, 2008

(65) Prior Publication Data

US 2009/0021292 A1    Jan. 22, 2009

Related U.S. Application Data

(60) Provisional application No. 60/950,867, filed on Jul. 19, 2007.

(51) Int. Cl.
*H03L 5/00*    (2006.01)
(52) U.S. Cl. .............................. 327/333; 326/80; 326/81
(58) Field of Classification Search ................. 327/333; 326/80, 81
See application file for complete search history.

(56) References Cited

U.S. PATENT DOCUMENTS

| | | | |
|---|---|---|---|
| 5,153,451 A | 10/1992 | Yamamura et al. | |
| 6,788,125 B1 | 9/2004 | Tomsio | |
| 6,920,570 B2 | 7/2005 | Fujimoto et al. | |
| 7,397,279 B2* | 7/2008 | Bhattacharya et al. | 326/80 |
| 7,400,168 B2* | 7/2008 | Katou | 326/68 |
| 7,468,615 B1* | 12/2008 | Tan et al. | 326/68 |
| 7,471,106 B2* | 12/2008 | Jahan et al. | 326/68 |
| 7,501,856 B2* | 3/2009 | Huang | 326/81 |
| 7,518,412 B2* | 4/2009 | Hasegawa et al. | 327/66 |
| 2007/0008003 A1 | 1/2007 | Boerstler et al. | |

* cited by examiner

*Primary Examiner*—Kenneth B. Wells
(74) *Attorney, Agent, or Firm*—Horizon IP Pte Ltd

(57) ABSTRACT

The present invention relates to integrated circuits. In particular, it relates to an IC comprising a receiving stage for receiving an input signal, an output stage for generating an output signal having a larger voltage range than the input signal and a level shifter. Embodiments of the invention provide a structure and a method for fabricating the IC wherein the level shifter is incorporated within the IC to improve reliability of the IC.

22 Claims, 3 Drawing Sheets

RELIABLE LEVEL SHIFTER OF ULTRA-HIGH VOLTAGE DEVICE USED IN LOW POWER APPLICATION

BACKGROUND

In an integrated circuit (IC), it is not uncommon for both high and low voltage devices to be included on the same IC. For example, the IC may include 1.5V digital core device and 6V high voltage devices. The supply voltages for such 1.5V and 6V devices are 0.95V ($DV_{DD}$) and 3.4V ($V_H$), respectively.

Level shifters are used to transform a digital core device or transistor digital power supply ($DV_{DD}$) voltage signal to a high power device or transistor power supply ($V_H$) voltage signal. FIG. 1 shows a conventional level shifter for transforming a $DV_{DD}$ voltage signal to a $V_H$ voltage signal. As shown, the level shifter includes an input stage 101 and an output stage 103. The input stage receives an input voltage $V_{in}$ and generates an output voltage $V_{out}$. $V_{in}$ is a $DV_{DD}$ voltage signal having a voltage range of about 0-0.95V while $V_{out}$ is a $V_H$ voltage signal having a voltage range of about 0-3.5V.

The various stages of the level shifter employ 6V high voltage devices with a $V_H$ supply source. Devices typically have a minimum 'turn on' threshold voltage (Vth) of about 15% of the supply voltage, i.e., for 6V high voltage devices, this equates to approximately 0.9V. As such, $V_{in}$ has about a 5% margin to switch on the 6V devices. Taking into consideration temperature fluctuation as well as process variations, such a small margin can lead to situations where the high voltage devices fail to switch on, rending the level shifter inoperable.

From the foregoing, it is desirable to provide an improved level shifter for transforming a low voltage range signal to a high voltage range signal.

SUMMARY

The present invention relates to level shifters used in integrated circuits. In one aspect of the invention, an IC with an input stage for receiving input signal with a first input voltage range further comprises three stages for generating an output signal having a second voltage range. The second stage in the aforementioned three stages of this IC decreases the magnitude of the first stage voltage to the third stage voltage to improve reliability.

In another aspect of the invention, a method of fabricating a semiconductor device is presented. The method includes providing an input stage for receiving an input signal having a first voltage range, and an output stage for generating an output signal having a second voltage range. The input stage has three stages with the first stage being coupled to a high voltage source and the third stage being coupled to a low voltage source and the second or intermediate stage decreases the magnitude of the first stage voltage to the third stage voltage to improve reliability.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

DESCRIPTION

Embodiments generally relate to ICs. The ICs can be any type of IC, for example dynamic or static random access memories, signal processors, or system-on-chip devices. The ICs can be incorporated into, for example, consumer electronic products, such as computers, cell phones, and personal digital assistants (PDAs). Embodiments can also relate to other types of applications. One embodiment relates to a level shifter. The level shifter, for example, is incorporated into an IC.

Figure 1:
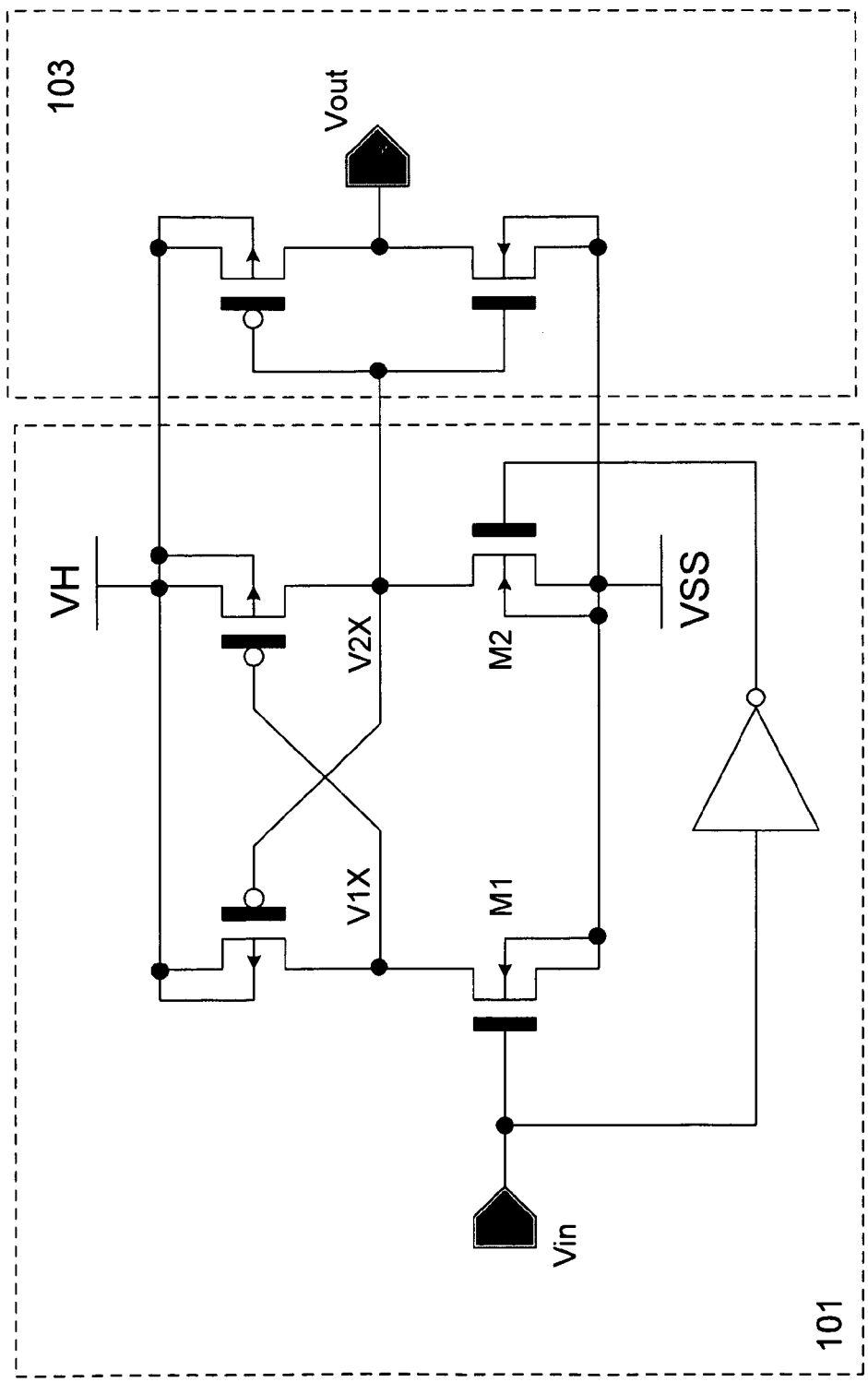
FIG. 1 illustrates a conventional level shifter.
Figure 2:
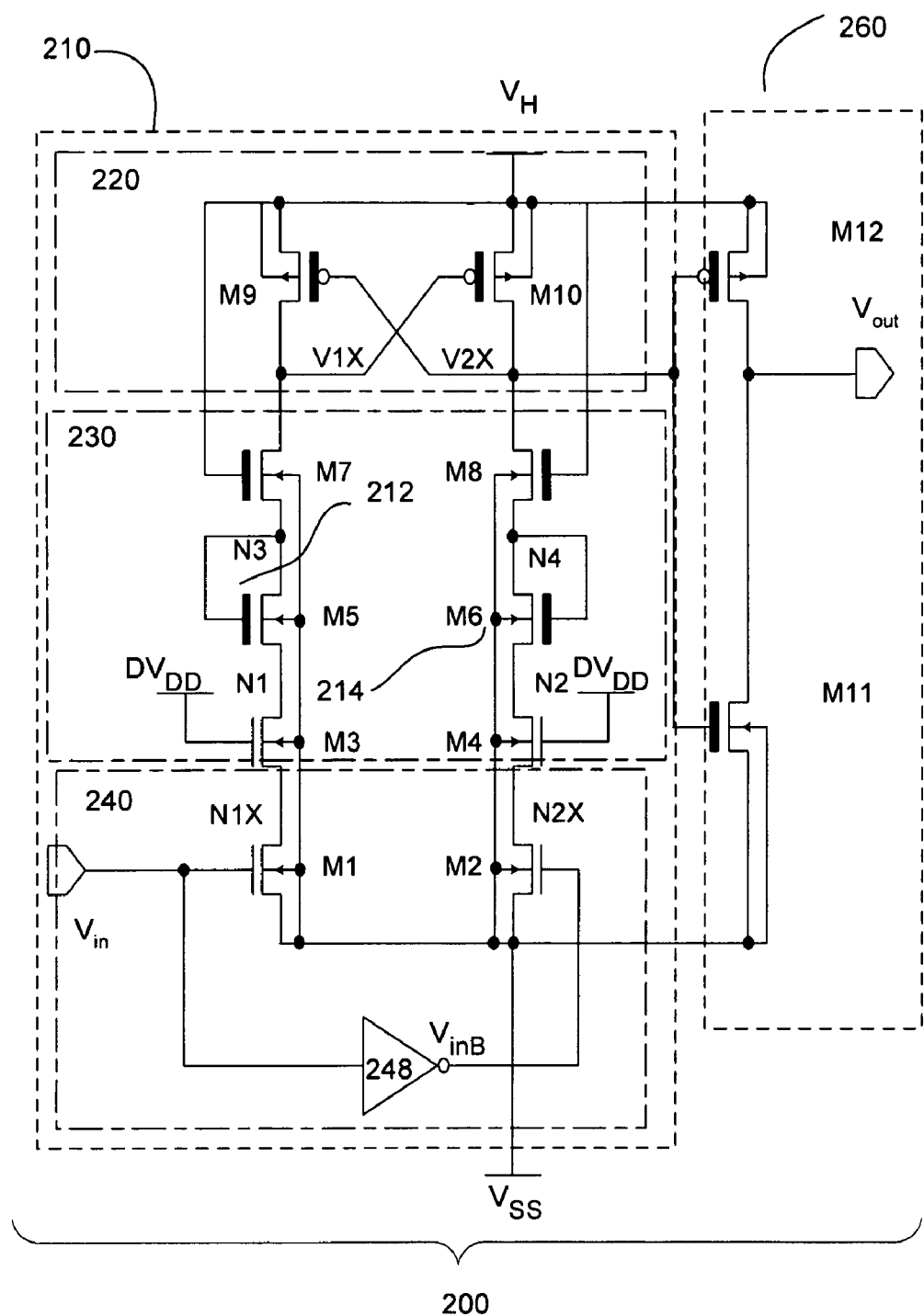
FIG. 2 illustrates a robust level shifter in accordance with one embodiment of the invention.

FIG. 2 shows an embodiment of a level shifter 200. As shown, the level shifter comprises input and output stages 210 and 260. The input stage receives an input signal $V_{in}$. The input signal comprises a first voltage range from, for example, 0-$V_1$. The input stage generates an output signal. In one embodiment, the output signal comprises a second voltage range, for example, from 0-$V_2$. $V_1$ in one embodiment is equal to $DV_{DD}$ while $V_2$ is equal to $V_H$. $DV_{DD}$, for example, may be the power supply for digital core devices or transistors of the IC while $V_2$ may be the power supply for high power devices or transistors. $DV_{DD}$, for example, may be equal to about 0.95V and $V_H$, for example, may be equal to about 3.4V. Other values for $DV_{DD}$ and $V_H$ are also useful.

The input stage, in one embodiment, comprises first and second current paths 212 and 214. Providing the input stage with other number of current paths may also be useful. The first and second current paths may be separated into first, second or intermediate and third stages 220, 230 and 240. In one embodiment, the first stage comprises first transistors M9 and M10. The first transistors comprise high voltage transistors, for example, 6V transistors. In one embodiment, the first transistors are p-type field effect transistors (pFETs). Other types of transistors, such as n-type field effect transistors (nFETs) or a combination of pFETs and nFETs, are also useful. As shown, the first transistors have a first terminal coupled to $V_H$, the power supply for high voltage transistors. The first transistors have gate terminals that are cross coupled to second terminals of the first transistors.

The third stage comprises third transistors M1 and M2 disposed in the first and second current paths. In accordance with one embodiment of the invention, the third transistors comprise low power transistors. As shown, the third transistors are low voltage nFETs. However, other types of transistors, such as pFETs or a combination of pFET and nFET, are also useful. In one embodiment, an inverter 248 is provided to invert $V_{in}$ ($V_{inB}$) to the third transistor gate terminal in the second current path. The second terminals of the third transistors are commonly coupled to ground ($V_{SS}$).

The intermediate stage is disposed between the first and third stages. The first terminals of the intermediate stage are coupled to the first stage and the second terminals are coupled to the third stage. In one embodiment, the second stage comprises second transistors in the first and second current paths. The second stage serves to decrease the voltage received from the first stage at the first terminals and provides the reduced voltage to the third stage at the second terminals. The second stage, in one embodiment, reduces the voltage to an intermediate voltage ($V_{int}$). $V_{int}$ is equal to a voltage between $V_H$ and $DV_{DD}$. In one embodiment, $V_{int}$ is sufficiently reduced to improve reliability of the third transistors. For example, the intermediate stage reduces the voltage to the third stage to below about 1.65V for 1.5V transistors. Decreasing the voltage in the third stage to other values is also useful.

In one embodiment, the intermediate stage comprises a combination of high and low voltage transistors M3-M8 in the first and second current paths. As shown, second transistors M5-M8 may be high voltage transistors configured in a diode connection. In one embodiment, second transistors M7 and M8 have their gate terminals coupled to $V_H$ while M5 and M6 have their gate terminals coupled to respective first or drain terminals. In another embodiment, second transistors M3 and M4 are low voltage transistors having their gate terminal coupled to $DV_{DD}$. Other combinations of second transistors to achieve the desired voltage to third stage are also useful. For example, the number of diode-connected transistors M5 and M6 may be increased in order to achieve a greater reduction at the second terminal.

As an example, the standard operating voltage for 1.5V transistors is 1.5V±10%. This means that the voltage on the drain terminals of the low voltage transistors should be lowered down to 1.65V or less. Second transistors M3-M8 are used to reduce the voltage to the third stage. The gate terminals of second transistors M7 and M8 are connected to $V_H$.

As such, the maximum voltage at nodes N3 and N4 will be equal to about $V_H$–Vth_DG, where Vth_DG is the threshold voltage of a high voltage device. Second transistors M5 and M6 are diode-connected transistors which are used to further lower down the level of voltage passing through M5 and M6. Thus the maximum voltage at node N1 and N2 will be further reduced to $V_H$–Vth_DG–Vth_DG. The gates of second transistors M3 and M4 are connected to $DV_{DD}$. Second transistors M3 and M4 are also used to reduce the level of voltage passing through M3 and M4.

Thus the maximum voltage level at nodes N1X and N2X will be $DV_{DD}$–Vth_nfet where Vth_nfet is the threshold voltage of a low-voltage device (e.g., 1.5V device in this case).

When $V_{in}$=0V and $V_{inB}$=$DV_{DD}$, third transistor M1 is turned off and third transistor M2 is turned on. The drain to source voltage ($V_{DS}$) of second transistor M3 is equal to about $V_H$–Vth_DG×2–($DV_{DD}$–Vth_nfet), which is about 1V in current design at the worst case. The $V_{DS}$ of second transistor M4 is zero. The drain to gate voltage |$V_{DG}$| of second transistor M3 is equal to about $V_H$–Vth_DG×2–$DV_{DD}$, which for example can be about 0.8V at the worst case. The |$V_{DG}$| of second transistor M4 can be equal to about $DV_{DD}$. When $V_{in}$=$DV_{DD}$ and $V_{inB}$=0V, third transistor M2 is turned off and third transistor M1 is turned on. The $V_{DS}$ of second transistor M4 is $V_H$–Vth_DG×2–($DV_{DD}$–Vth_nfet), which is about 1V in current design at the worst case. The $V_{DS}$ of second transistor M3 is zero. The |$V_{DG}$| of second transistor M4 is $V_H$–Vth_DG×2–$DV_{DD}$, which for example can be about 0.8V at the worst case. The |$V_{DG}$| of the second transistor M3 is $DV_{DD}$.

In one embodiment, the output stage comprises an inverter circuit. The inverter circuit can comprise high voltage transistors M11 and M12. In one embodiment, M12 comprises a p-type transistor and M11 comprises an n-type transistor. The first terminal of M12 is coupled to $V_H$. The second terminal of M12 is coupled to the first terminal of M11 while the second terminal of M11 is coupled to $V_{SS}$. The gate terminals of M11 and M12 are commonly coupled to the second terminal of M10 of the first input stage. Other configurations of the output stage are also useful.

Figure 3:
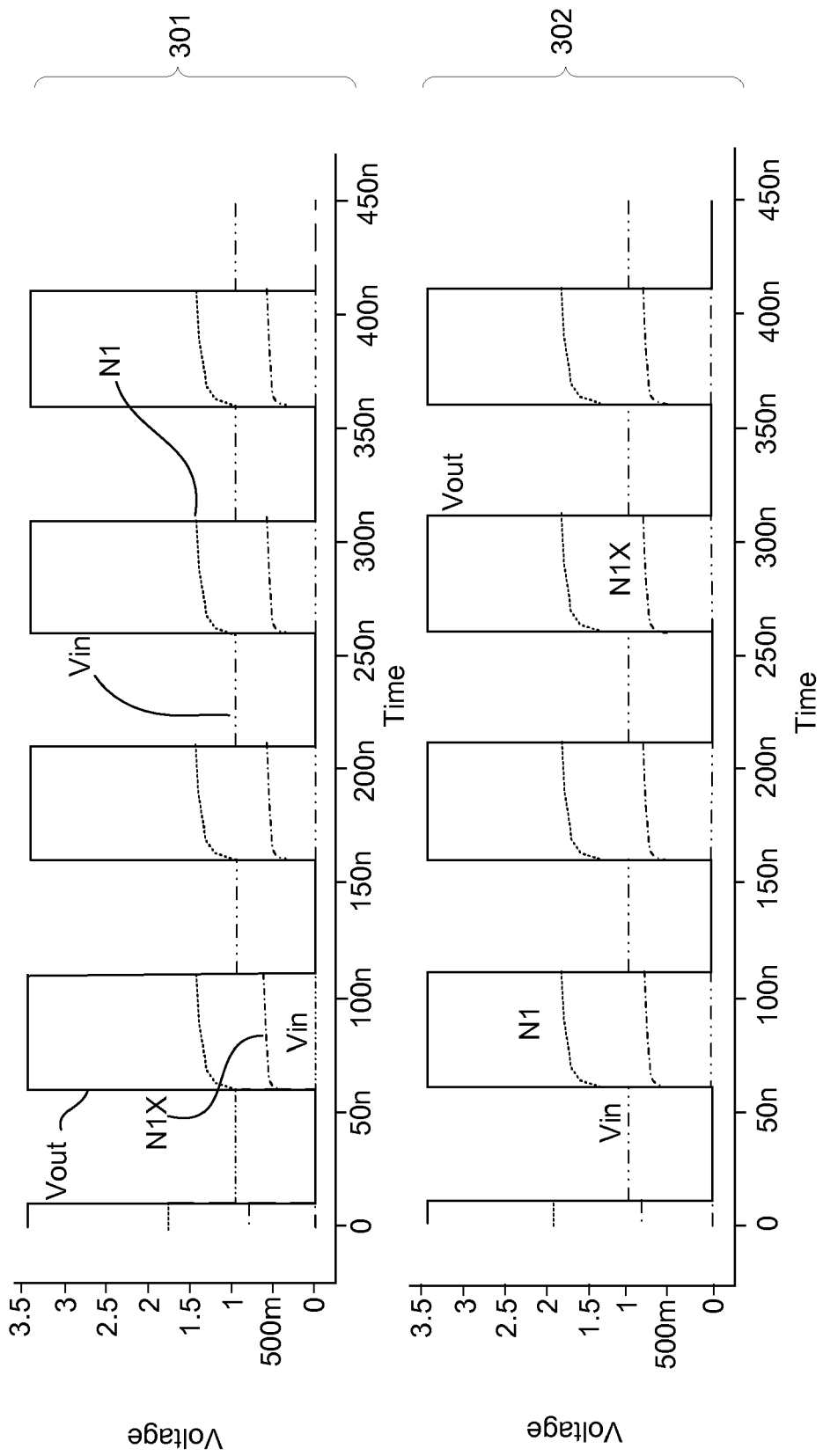
FIG. 3 illustrates simulated waveform results in accordance with one embodiment of the invention.

FIG. 3 shows simulated voltage waveforms of a level shifter in accordance with one embodiment. The level shifter was simulated at different temperature conditions. In particular, waveforms 301 show voltage characteristics of the level shifter at −40° C. and waveforms 302 show voltage characteristics of the level shifter at 125° C. The $DV_{DD}$ and $V_H$ are not changed for both temperature conditions.

In both cases, the voltage drop $V_{DS}$ across M3 (or M4) does not exceed the upper limit of the operating range of the transistor which is 1.5V+10%, thus demonstrating robustness of the present invention as well as the capability to work under 'worst case' situations. Worst case refers to process parameters which are shifted to Fast-N-Fast-P corner. Under such conditions, voltage stress on the drain & gate-oxide of M3 (or M4) is at its largest.

In particular, the threshold voltage Vth changes with temperature. For example, Vth increases as temperature is reduced. The extreme worst case is when $V_{in}$ is at ultra low voltage with process parameters shifted to fast corner under low temperature. As process is shifted to fast corner, Vth is increased. When temperature is reduced at fast corner, Vth is increased further. Thus the margin to turn on the device becomes smaller and critical under such conditions. In conventional level shifters, Vth can be higher than $V_{in}$, causing turn on failure for the device. This results in non operability of the level shifter. In contrast to conventional applications, the present invention prevents the possibility of Vth from being higher than $V_{in}$ without increasing stress on the gate oxide of the device.

As apparent from FIG. 3, the present invention provides a reliable level shifter which can be implemented without the use of native devices, such as those which have a negative or zero $V_{th}$. This results in reduced manufacturing cost since no additional mask or process steps are needed.

Furthermore, using low voltage devices as third transistors and lowering the voltage across the third transistors results in a larger operating window. In addition, this larger operating window is achieved without incurring high voltage stress on the drain and gate oxide of the low voltage devices, increasing the lifespan of the devices.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of the equivalency of the claims are intended to be embraced therein.

What is claimed is:

1. An integrated circuit (IC) comprising:
 an input stage for receiving an input signal $V_{in}$; and
 an output stage coupled to the input stage, the output stage generates an output signal $V_{out}$;
  wherein the input stage comprises
   a first stage and the first stage is coupled to a high voltage source $V_H$;
   a second stage coupled to the first stage; and
   a third stage coupled to the second stage, the third stage receiving $V_{in}$, wherein the second stage comprises a set of diode-connected transistors for reducing the level of voltage passing through them thereby reducing a magnitude of $V_H$ to improve reliability.

2. The IC of claim 1 wherein the second stage comprises a plurality of diode-connected transistors for further reducing the level of voltage passing through them.

3. The IC of claim 1 wherein the third stage is powered by a low voltage source $DV_{DD}$.

4. The IC of claim 1 wherein $V_{in}$ comprises a voltage range and $V_{out}$ comprises a voltage range and $V_{in}$ has a magnitude less than or equal to $DV_{DD}$.

5. The IC of claim 1 wherein the first stage comprises first transistors, the second stage further comprises second transistors and the third stage comprises third transistors.

6. The IC of claim 5 wherein the first transistors comprise high voltage transistors and the third transistors comprise low voltage transistors.

7. The IC of claim 1 wherein the second transistors further comprise high and low voltage transistors.

8. The IC of claim 1 wherein the output stage comprises fourth transistors, the fourth transistors comprise high voltage transistors.

9. The IC of claim 1 wherein the output stage is coupled to the high voltage source $V_H$.

10. The IC of claim 1 wherein $V_{out}$ has a magnitude less than or equal to $V_H$.

11. A level shifter comprising:
    a first stage coupled to a high voltage source $V_H$, the first stage comprises first transistors and the first transistors comprise high voltage transistors;
    a second stage coupled to the first stage, the second stage comprises second transistors; and
    a third stage coupled to the second stage for receiving an input signal $V_{in}$, the third stage comprises third transistors and the third transistors comprise low voltage transistors, wherein the second stage transistors comprise a set of diode-connected transistors for reducing the level of voltage passing through them thereby reducing a magnitude of $V_H$ to improve reliability.

12. The level shifter of claim 11 wherein the second stage transistors comprise a plurality of diode-connected transistors for further reducing the level of voltage passing through them.

13. The level shifter of claim 11 wherein the input signal has a magnitude less than or equal to $DV_{DD}$ and the third transistors are powered by a low voltage source having a magnitude $DV_{DD}$.

14. The level shifter of claim 11 wherein the second transistors further comprise high and low voltage transistors.

15. The level shifter of claim 11 wherein:
    the first, second and third transistors are nFETs; or
    the first, second and third transistors are pFETs; or
    the first, second and third transistors are a combination of nFETs and pFETs.

16. The level shifter of claim 11 wherein threshold voltage of the first transistors can be higher than a low voltage source $DV_{DD}$.

17. A method of forming an integrated circuit (IC), the method comprising the steps of:
    providing an input stage for receiving an input signal $V_{in}$; and
    providing an output stage for generating an output signal $V_{out}$, said output stage being coupled to the input stage;
    wherein the input stage comprises
        a first stage coupled to a high voltage source $V_H$;
        a second stage coupled to the first stage; and
        a third stage coupled to the second stage, the third stage for receiving $V_{in}$, wherein the second stage comprises a set of diode-connected transistors for reducing the level of voltage passing through them thereby reducing a magnitude of $V_H$ to improve reliability.

18. The method of claim 17 wherein the first stage comprises first transistors, the second stage further comprises second transistors, the third stage comprises third transistors and the output stage comprises fourth transistors.

19. The method of claim 18 wherein the first transistors comprise high voltage transistors, the third transistors comprise low voltage transistors and the fourth transistors comprise high voltage transistors.

20. The method of claim 17 wherein the input stage comprises a low voltage source $DV_{DD}$ coupled to low voltage third transistors.

21. The method of claim 17 wherein the output stage is coupled to the high voltage source $V_H$, and $V_{out}$ has a magnitude less than or equal to $V_H$.

22. The method of claim 17 wherein the second stage comprises a plurality of diode-connected transistors for further reducing the level of voltage passing through them.

* * * * *